(12) United States Patent
Bouchkour et al.

(10) Patent No.: US 10,107,690 B2
(45) Date of Patent: Oct. 23, 2018

(54) MEASURING TEMPERATURE OF METALLIC PART UNDER UNIAXIAL DEFORMATION PRESSURE BY OPTICAL PYROMETRY

(71) Applicant: COMMISSARIAT A L'ENERGIE ATOMIQUE ET AUX ENERGIES ALTERNATIVES, Paris (FR)

(72) Inventors: Zakaria Bouchkour, Fleury les Aubrais (FR); Camille Chauvin, Leyme (FR); Frederic Sinatti, Leyme (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/564,992

(22) PCT Filed: Apr. 11, 2016

(86) PCT No.: PCT/EP2016/057904
§ 371 (c)(1),
(2) Date: Oct. 6, 2017

(87) PCT Pub. No.: WO2016/166053
PCT Pub. Date: Oct. 20, 2016

(65) Prior Publication Data
US 2018/0120164 A1 May 3, 2018

(30) Foreign Application Priority Data
Apr. 13, 2015 (FR) ..................... 15 53196

(51) Int. Cl.
*G01J 5/00* (2006.01)
*B32B 9/00* (2006.01)
*B32B 15/00* (2006.01)
*G01J 5/04* (2006.01)
*B32B 27/42* (2006.01)
*B32B 27/06* (2006.01)
*C23C 16/26* (2006.01)
*C23C 14/06* (2006.01)

(52) U.S. Cl.
CPC ............ *G01J 5/046* (2013.01); *B32B 27/065* (2013.01); *B32B 27/42* (2013.01); *G01J 5/0003* (2013.01)

(58) Field of Classification Search
CPC ................................ G01J 5/046; G01J 5/0003
USPC .................................................. 356/43; 374/9
See application file for complete search history.

(56) References Cited

U.S. PATENT DOCUMENTS

| | | |
|---|---|---|
| 5,837,331 A | 11/1998 | Menu et al. |
| 6,078,133 A | 6/2000 | Menu et al. |
| 6,261,693 B1 | 7/2001 | Veerasamy |
| 2001/0014398 A1 | 8/2001 | Veerasamy |
| 2002/0012798 A1 | 1/2002 | Veerasamy |
| 2004/0074260 A1 | 4/2004 | Veerasamy |
| 2006/0166009 A1 | 7/2006 | Veerasamy |
| 2007/0104953 A1 | 5/2007 | Sugita |
| 2008/0220257 A1 | 9/2008 | Dekempeneer |
| 2010/0047464 A1 | 2/2010 | Veerasamy |
| 2010/0260994 A1 | 10/2010 | Groenen et al. |
| 2015/0099123 A1 | 4/2015 | Barbee et al. |

FOREIGN PATENT DOCUMENTS

| | | |
|---|---|---|
| EP | 0 795 622 A1 | 9/1997 |
| EP | 1 338 576 A1 | 8/2003 |
| JP | 2-143912 A | 6/1990 |
| WO | 2007/020139 A1 | 2/2007 |
| WO | 2009/080610 A1 | 7/2009 |
| WO | 2013/075061 A1 | 5/2013 |

OTHER PUBLICATIONS

International Search Report dated Jul. 5, 2016 in PCT/EP2016/057904 filed Apr. 11, 2016.
French Search Report dated Feb. 2, 2016 in FR 1553196 filed Apr. 13, 2015.
Chauvin, Camille, "Contribution a la mesure de temperature des materiaux sous choc modere par pyrometrie optique," HAL archives-ouvertes, Apr. 2010, XP055237324, pp. 1-215 (214 pages, an extraneous blank page was removed).
Perez, Michel, "Residual Temperature Measurements of Shocked Copper and Iron Plates by Infrared Pyrometry," Shock Compression of Condensed Matter 1991, 1992, pp. 737-740.
Perez, M., "Pyrometric Infrarouge de Precision Pour Mesure de la Temperature Post-Choc de Materiaux Metalliques Dans la Gamme 70-1000° C.," Journal de Physique IV, Colloque C3, supplement au Journal de Physique III, vol. 1, 1991, pp. 371-378 (with English Abstract).
Chauvin, Camille et al., "An application of the emissive layer technique to temperature measurement by infrared optical pyrometer," Shock Compression of Condensed Matter 2011, AIP Conf. Proc. 1426, 2012, pp. 368-371.
Grill, Alfred, "Diamond-like carbon: state of the art," Diamond and Related Materials, 8, 1999. pp. 428-434.

*Primary Examiner* — William P Fletcher, III
(74) *Attorney, Agent, or Firm* — Oblon, McClelland, Maier & Neustadt, L.L.P.

(57) ABSTRACT

A method for preparing a metal part pressurized under isentropic, shock-type or compression-type, uniaxial deformation conditions, so as to measure the temperature of same by optical pyrometry. The method includes forming an emissive coating on a face of the metal part, having a thickness of 250 to 550 nm, and fixing an anvil-shaped window on the emissive coating. The emissive coating includes a first and a second layer of amorphous carbon, the first layer being inserted between the face of the metal part and the second layer, and having a carbon hybridization rate $sp^3$ greater than the carbon hybridization rate $sp^3$ of the second layer. A method for measuring, by optical pyrometry, the temperature of a metal part pressurized under isentropic, shock-type or compression-type, uniaxial deformation conditions.

8 Claims, 1 Drawing Sheet

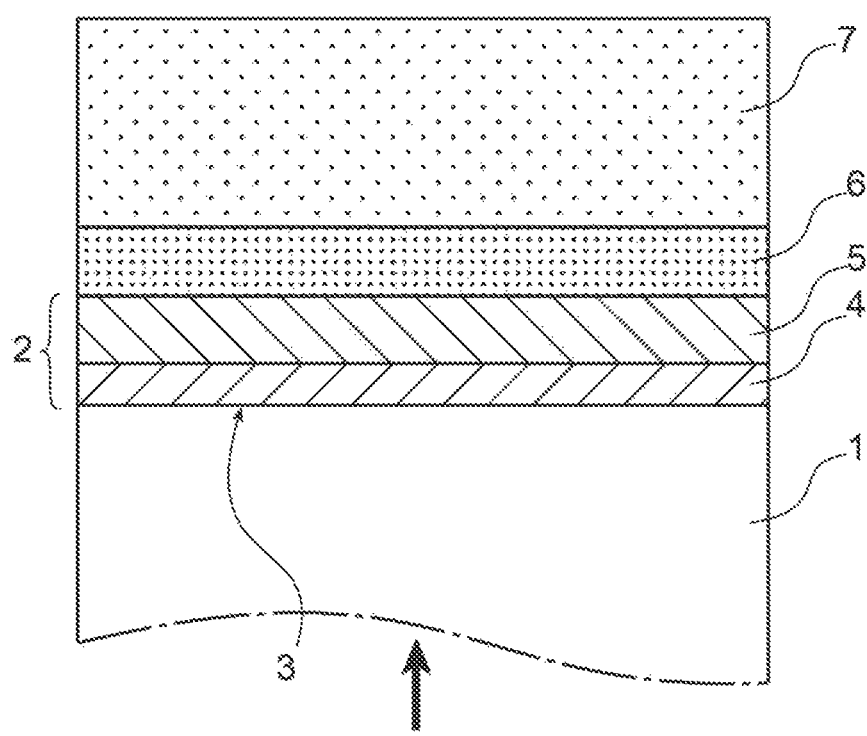

MEASURING TEMPERATURE OF METALLIC PART UNDER UNIAXIAL DEFORMATION PRESSURE BY OPTICAL PYROMETRY

TECHNICAL FIELD

The field of the invention is that of the measurement of the temperature, by optical pyrometry, of metal parts put under pressure under uniaxial deformation conditions, for example of the shock type of the isentropic compression type.

The concern is in particular with a particular multilayer coating that will make it possible to improve the precision of the measurement of the temperature on such parts.

PRIOR ART

In the context of the present invention, the concern is with the measurement of the temperature of a metal part subjected to a particular dynamic mechanical stress when it is put under pressure under uniaxial deformation conditions. It may be a case for example of flat impact tests (dynamic stressings by shock) or tests of the isentropic compression type.

When the temperature of a metal part is measured by optical pyrometry, the temperature is deduced from the infrared radiation emitted by the part. However, ignorance of the emissivity of the material of the part in question introduces the main source of uncertainty about the measurement of the temperature, and the measurement technique itself does not suffice to be completely free from ignorance of this parameter.

Several works have been carried out in order to attempt to reduce the influence of this parameter on the temperature measurements, either by measuring the emissivity of the material during experiments, by calculating it from luminances measured by the pyrometers, by framing it or by increasing the apparent emissivity of the surface of the part.

Researchers have attempted in the past to combine the last two solutions by increasing the apparent emissivity of the surface of the part, thus making it possible to reduce the uncertainty about the temperature by proceeding with a more precise framing of the emissivity. The apparent emissivity of the part is increased by applying a coating with a high emissivity, thus imitating the emission of a black body. This method was used in the works by Perez (documents [1] and [2]), using coatings of platinum (Pt) or of rhenium silicide ($ReSi_2$) to obtain emissivities ranging up to 0.8.

The main difficulty with this technique is obtaining a coating that is opaque, in order to conceal the radiation coming from the underlying part, and which is fine and adherent, so that the heat exchanges between the part and the cladding are sufficiently rapid with respect to the characteristic time for putting under pressure under unit axial deformation conditions (ranging from around one hundred nanoseconds to a few microseconds).

Moreover, in order to respond to the problems of studies under shock or other dynamic mechanical stresses (compression, tension), the mechanical and thermal properties of the material constituting the coating must be known (in particular its thermal conductivity and its mechanical properties under stress). However, many of these properties are not known from the materials used up until now. Document [3] reflects the problem of lack of knowledge of properties under shock, revealing the difficulties encountered for implementing experiment/calculation correlations during experiments of temperature measurements under shock using emissive coatings where the properties under mechanical stress are little or not referenced.

DISCLOSURE OF THE INVENTION

The objective of the invention is to improve the measurement of temperature by optical pyrometry (infrared pyrometry) of a metal part put under pressure under uniaxial deformation conditions.

To this end, the invention proposes a method for preparing a metal part so as to to measure the temperature thereof by optical pyrometry when the part is put under pressure under uniaxial deformation conditions of the shock type or of the isentropic compression type, the method comprising the formation of an emissive coating on one face of the metal part and the method being characterised in that the emissive coating has a thickness of between 250 nm and 550 nm and comprises a first layer of amorphous carbon and a second layer of amorphous carbon, the first layer being interposed between the face of the metal part and the second layer, and having a degree of carbon hybridisation $sp^3$ greater than the degree of carbon hybridisation $sp^3$ of the second layer, the method further comprising the fixing, on the emissive coating, of an anvil window.

In the context of the present invention, an emissive coating is a coating, the thermal emissivity value of which is greater than or equal to 0.7 in the spectral domain of the infrared thermal radiation to be detected. In this case, the thermal emissivity value of the coating is chosen so as to be greater or equal to 0.7 in the IR spectral domain ranging from 1.5 μm to 5.5 μm in wavelength, which is the detection spectral range of the optical pyrometer used.

The emissive coating according to the invention comprises a first layer and a second layer, both made from amorphous carbon. It will be recalled that amorphous carbon (also referred to as DLC, standing for "diamond-like carbon"), is a carbon material comprising $sp^2$ bonds and $sp^3$ bonds, as well as a more or less great possible concentration of hydrogen atoms. It is thus possible to have layers of non-hydrogenated amorphous carbon, of the a-C (standing for "amorphous carbon") type or of the ta-C (standing for "tetrahedral amorphous carbon") type, or of hydrogenated amorphous carbon, of the a-C:H type or of the ta-C:H type.

The method according to the invention comprises the fixing, on the emissive coating, of a particular element referred to as an "anvil window". The anvil window makes it possible to maintain the mechanical stress applied to the metal part (at least during the period during which the required force is applied to the part being studied and to its coating), thus avoiding the ambient pressurisation of the part, while mechanically holding said part. The fixing of this element on the coating can be obtained by means of a fine layer of adhesive, chosen so that it does not interfere with the measurement of the infrared range being studied during the optical pyrometry measurement. In other words, the adhesive chosen must be transparent to IR.

The choice of the anvil window for its part is made so that the heat flux issuing from the metal part and from the emissive coating is not (or only very little) absorbed by the anvil window in the range of wavelengths of the optical pyrometry used: the anvil window is therefore transparent in the range of wavelengths of the pyrometer. It could for instance be a block of PMMA (polymethyl methacrylate) or sapphire. Preferably a lithium fluoride (LiF) crystal is chosen.

According to a preferred embodiment of the invention, the first and second layers preferably have an atomic hydrogen content of less than 20%, preferentially less than 10%. Naturally, when the atomic hydrogen content of a layer is spoken of, it is a case of the number of hydrogen atoms compared with the total number of atoms present in this layer. Reference can be made for example to the ternary diagram illustrated in FIG. 1 of document [4]. Thus, preferably, the amorphous carbon of the first and second layers is a non-hydrogenated amorphous carbon. To minimise the hydrogen atom content of the amorphous carbon layer, it is possible to use conditions of production of the layers unfavourable to the appearance of hydrogenated deposits: high vacuum and avoiding the use of gas containing hydrogen atoms (hydrocarbons, methane, etc.). In this case, in the preferred embodiments that are described below, the formation of the amorphous carbon layers was obtained under high vacuum and using argon as a plasmagenic gas.

The advantage of the use of amorphous carbon for the first and second layers lies firstly in the high emissivity of this material (close to a black body), secondly in the knowledge of its thermal and mechanical properties under stress, and finally in its opacity. In the end, these two layers make it possible to increase the thermal emittance of the metal part and will make it possible to improve the quality of the signal received by the optical pyrometer during the measurement of the temperature of the metal part under mechanical stress and thus to increase the precision of the associated simulations enabling the temperature of the part to be calculated.

The difference between the degree of hybridisation $sp^3$ of the first and second layers is an important point in the context of the present invention. This is because the inventor found that, in the absence of the first layer, the second layer had a tendency to flake once its thickness went beyond 300 mm. The flaked layer is then impaired and unsuitable for a measurement of surface temperature under dynamic mechanical stress: the flaked zones show that the deposit is no longer adherent to the part, thus causing a detachment and/or insertions of air, which give rise to the appearance of undesired signals (parasitic radiation, significant artefacts) during the measurement. In the context of the invention, the degree of hybridisation $sp^3$ being higher in the first layer compared with the second layer, a more "diamond studded" first layer and a more "graphite studded" second layer are obtained. The inventor assumes that the presence of the first layer facilitates the attachment of the second layer, in particular through the better affinity of the carbon-carbon bonds.

According to a preferred embodiment, the first layer has a thickness of between 50 and 150 nm, preferably equal to 100 nm, and the second layer has a thickness of between 200 and 400 nm, preferably equal to 300 nm. Preferably, the emissive coating consists solely of the first and second layers of amorphous carbon and the emissive coating has a total thickness of between 250 and 550 nm.

Good knowledge of the thickness of the layers making up the emissive coating being essential for the applications and having an influence on the end result of the measurement of temperature of the part, the thicknesses of the layers were measured and checked by several methods:

by measuring the height of a step on a face of the part, a portion of which comprises the emissive coating and the other portion of which remains bare (without emissive coating). This step is created by concealing a portion of the face of the part when the emissive coating is formed. The height of the step thus obtained is next measured by two techniques:

by white-light scanning interferometry using a microscope with Michelson interferometric lenses, for example a NewView™ 6200 microscope from Zygo;

by mechanical profilometry using a stylus the tip of which is in contact with the surface and recording of the deflections of the tip, using for example the Surftest SJ401 apparatus from Mitutoyo;

by observation of a cross-section of the emissive coating by scanning electron microscopy and measurement of the thickness of the coating observed;

analysis of the emissive coating by spectroscopic ellipsometry giving access to the thicknesses of the coating, for example using a UVISEL™ ellipsometer from Horiba Jobin Yvon.

According to a preferred embodiment, the method further comprises the polishing of the face of the metal part until a roughness of the surface of the face of 10 to 30 nm is obtained, the polishing being carried out before the formation of the emissive coating.

Advantageously, the formation of the emissive coating comprises the formation of the first layer on the face of the part by radio-frequency cathodic sputtering of a carbon target.

Advantageously, the formation of the emissive coating comprises the formation of the second layer on the first layer by physical vapour deposition by bombardment of a graphite target by electron beam.

The invention also relates to a method for measuring, by optical pyrometry, the temperature of a metal part put under pressure under uniaxial deformation conditions of the shock or isentropic compression type, the measurement method comprising the following successive steps:

the preparation of the metal part by implementing the preparation method as described above;

the application, to the metal part, of a pressure under uniaxial deformation conditions of the shock or isentropic compression type;

the measurement of the intensity of an infrared radiation emitted by the emissive coating; and conversion of the intensity thus measured into a value of the temperature of the metal part put under pressure.

The conversion can be done using a conversion table previously determined by calibration of the optical pyrometer.

The temperature of the emissive coating is in thermal equilibrium with that of the metal part under pressure; the conversion of the intensity of the infrared radiation emitted by the coating therefore makes it possible to deduce the temperature of the underlying metal part.

The advantage of the first and second amorphous carbon layers according to the invention is that they can be produced easily and quickly. The method for preparing the part is thus simple to implement and inexpensive. Furthermore, according to a particular embodiment, the first and second layers can be produced in the same physical vapour deposition (PVD) reaction chamber with a reactor equipped with each of the two PVD deposition technologies for producing the first and second layers (radio-frequency cathodic sputtering of a carbon target for the first layer and bombardment of a graphite target by electron beam for the second layer).

Other features and advantages of the invention will emerge more clearly from the reading of the additional description that follows, which refers to the accompanying single FIGURE.

Naturally, this additional description is given only by way of illustration of the invention and under no circumstances constitutes a limitation thereof.

BRIEF DESCRIPTION OF THE FIGURE

The single FIGURE shows a schematic view in longitudinal section of the architecture of the assembly formed by the metal part, the multilayer coating and the "anvil window" element according to a possible embodiment of the invention. The arrow illustrates the direction of propagation of the putting of the part under pressure under uniaxial deformation conditions.

DETAILED DISCLOSURE OF PARTICULAR EMBODIMENTS

In order to illustrate the preparation method that is the subject matter of the invention, we shall now describe an example of preparation of a metal part according to the invention.

The metal part that we are going to use in this example is a copper disc, having a diameter of 40 mm and a thickness of 4 mm.

It is preferable to carry out a polishing of the surface of the metal part intended to receive the multilayer coating, so as to obtain a mean roughness of between 10 and 30 mm. This polishing facilitates the attachment of the multilayer coating, it also makes it possible to avoid the presence of any surface roughness that may be the site of creation of hot spots, in the case of experiments under shock, disturbing the measurements of the temperature of the part.

The polishing may for example be carried out using a rotary polisher equipped successively with abrasive discs having a finer and finer roughness, and with felt discs on which diamond suspensions are sprayed in order to carry out a finishing polishing.

We have presented in the following table the range of abrasive discs and felt discs that we use, as well as their use parameters.

| Type of abrasive | Duration (minutes) | Pressure force (N) | Rotation speed of abrasive (revolutions/minute) |
|---|---|---|---|
| SiC 1200 disc | 2 | 25 | 220 |
| SiC 2400 disc | 2 | 25 | 220 |
| SiC 4000 disc | 2 | 25 | 220 |
| 3 μm diamond suspension | 2 | 25 | 220 |
| 3 μm diamond suspension | 2 | 20 | 190 |

This polishing is followed by cleaning, for example using a mixture of ethanol and acetone, and then drying of the part, for example by compressed air or compressed inert gas, if there is a concern about obtaining surface oxidation of the part.

Depending on the thickness of the emissive coating that it is wished to obtain and the type of part to be coated, the thicknesses of the first and second amorphous carbon layers will be adapted.

In this exemplary embodiment, a first layer of amorphous carbon is produced with a thickness of 100 nm by radiofrequency cathodic sputtering (RFPVD, standing for "radiofrequency physical vapour deposition") of a carbon target. The deposition is carried out in a physical vapour deposition reaction chamber and the deposition parameters are for example:
nature of the plasmagenic gas: argon
RF power: 75 W
working pressure: $1.10^{-1}$ mbar
carbon target/substrate distance: 2.5 cm
duration: 5 minutes Next, on this first layer, a second amorphous carbon layer with a thickness of 300 nm is produced. This second layer is for example produced by electron beam physical vapour deposition (EBPVD) in the same PVD reaction chamber used for producing the first layer. The deposition parameters are for example:
electron gun power: 900 W
working pressure: $5.10^{-5}$ mbar
carbon source/substrate distance: 15 cm
duration: 30 minutes The thickness of the multilayer coating is thus 400 nm.

We carried out a semi-quantitative XPS (X-ray photoelectron spectroscopy) analysis of the first and second layers in order to quantify their degree of hybridisation $sp^3$. We obtained a 35% degree of hybridisation $sp^3$ and 65% hybridisation $sp^2$ for the first layer and a 30% degree of hybridisation $sp^3$ and 70% hybridisation $sp^2$ for the second layer.

A layer of glue is next deposited on the multilayer coating and makes it possible to fix a so-called "anvil window" on the coating.

The layer of glue and the anvil window are chosen so that they are transparent in the range of wavelengths (IR) captured by the optical pyrometer that it is wished to use. This is because the heat flux issuing from the metal part must not to a major extent be absorbed by the layer of glue or by the anvil window, so that the measurement carried out can be used and corresponds to the temperature issuing from the metal part with the coating.

It is possible for example to use a resin resulting from a mixture of Araldite™ AY 103-1 and Aradur™ HY 951 at 10% to fix the anvil window on the coating and a lithium fluoride crystal, with a thickness of between 10 and 20 mm, as the anvil window.

In our exemplary embodiment, a 10 m thick layer of resin is deposited on the coating and, within a period of between 5 and 60 seconds, the lithium chloride crystal is disposed on this resin while it is still liquid (before polymerisation thereof): the still liquid adhesive then spreads over the entire common surface between the coating part and the LiF crystal. Next a pressure of 2 kg is applied for a period of between 8 and 12 hours to the crystal, in order to obtain a final thickness of glue of less than 10 micrometers over the whole of the glued surface.

The metal part thus prepared is shown in the single FIGURE: the metal part 1 comprises, on one of its faces 3, a multilayer coating 2 consisting here of a first layer of amorphous carbon 4 and a second layer of amorphous carbon 5, a layer of glue 6 and an element 7 that will serve as an anvil window. In this FIGURE, the direction of the dynamic mechanical force is applied to the bottom face of the metal part 1 and is represented by the arrow.

REFERENCES CITED

[1] Perez M.
"Residual temperature measurements of shocked copper and iron plates by infrared pyrometry", *Shock Waves of Condensed Matter* 1991, (1992), p. 737-740.

[2] Perez M.
"Precision infrared pyrometry for post-shock temperature measurements of metal materials in the range 70°-1000° C.", *Journal de Physique IV, Conference C3, supplement to the Journal de Physique III*, vol. 1, (1991), pp. 371-378.

[3] Chauvin C. et al.
"An application of the emissive layer technique to temperature measurement by infrared optical pyrometer", *Shock Compression of Condensed Matter* 2011, AIP Conf. Proc. 1426, (2012), pp. 368-371.

[4] Grill A.
"Diamond-like carbon: state of the art", *Diamond and Related Materials*, 8 (1999), pages 428-434.

The invention claimed is:

1. A method for preparing a metal part so as to measure a temperature of the metal part by optical pyrometry when the metal part is put under pressure under uniaxial deformation conditions of a shock type or of an isentropic compression type, the method comprising:

forming an emissive coating on one face of the metal part; and fixing, on the emissive coating, an anvil window, wherein the emissive coating has a thickness of between 250 nm and 550 nm and comprises a first layer of amorphous carbon and a second layer of amorphous carbon, the first layer being interposed between the face of the metal part and the second layer, and having a degree of carbon hybridisation $sp^3$ greater than a degree of carbon hybridisation $sp^3$ of the second layer.

2. The method according to claim 1, wherein the first layer has a thickness of between 50 and 150 nm and the second layer has a thickness of between 200 and 40 nm.

3. The method according to claim 2, wherein the emissive coating consists solely of the first and second layers of amorphous carbon.

4. The method according to claim 1, wherein the first and second layers have an atomic hydrogen content of less than 20%.

5. The method according to claim 1, further comprising:
polishing the face of the metal part until a surface roughness of the face of 10 to 30 nm is obtained, wherein the polishing is carried out before formation of the emissive coating.

6. The method according to claim 1, wherein formation of the emissive coating comprises formation of the first layer on the face of the part by radio-frequency cathodic sputtering of a carbon target.

7. The method according to claim 1, wherein formation of the emissive coating comprises formation of the second layer on the first layer by physical vapour deposition by bombardment of a graphite target by electron beam.

8. A method for measuring, by optical pyrometry, a temperature of a metal part put under pressure under uniaxial deformation conditions of a shock or isentropic compression type, the measurement method comprising:

preparing the metal part by implementing a preparation method according to claim 1;

applying to the metal part, a pressure under uniaxial deformation conditions of a shock or isentropic compression type;

measuring an intensity of an infrared radiation emitted by the emissive coating; and converting the intensity thus measured into a value of the temperature of the metal part put under pressure.

* * * * *